United States Patent [19]

Ikejiri et al.

[11] Patent Number: 5,324,766
[45] Date of Patent: Jun. 28, 1994

[54] RESIN COMPOSITION FOR FORMING PLATED LAYER AND USE THEREOF

[75] Inventors: Fumitoshi Ikejiri; Sanehiro Yamamoto; Keiji Kawamoto, all of Kuga, Japan

[73] Assignee: Mitsui Petrochemical Industries, Ltd., Tokyo, Japan

[21] Appl. No.: 138,390

[22] Filed: Oct. 20, 1993

Related U.S. Application Data

[60] Continuation of Ser. No. 928,085, Aug. 13, 1992, abandoned, which is a division of Ser. No. 549,067, Jul. 6, 1990, abandoned.

[30] Foreign Application Priority Data

Jul. 7, 1989 [JP] Japan .................. 1-176059
Sep. 7, 1989 [JP] Japan .................. 1-232404
Jun. 20, 1990 [JP] Japan .................. 2-161569

[51] Int. Cl.$^5$ .................. C08J 5/08; C08K 3/18; C08K 3/22; C08L 77/00
[52] U.S. Cl. .................. 524/433; 524/425; 524/451; 524/492; 524/493; 524/494; 524/607
[58] Field of Search .............. 524/425, 433, 451, 492, 524/607, 493, 494

[56] References Cited

U.S. PATENT DOCUMENTS 3,962,524  6/1976  Miyamoto et al. .................. 428/435
4,552,626 11/1985  Stevenson .................. 204/20
4,948,868  8/1990  Taguchi et al. .................. 528/339

FOREIGN PATENT DOCUMENTS 0121984 10/1984 European Pat. Off. .
0291833 11/1988 European Pat. Off. .
0394029 10/1990 European Pat. Off. .

*Primary Examiner*—Paul R. Michl
*Assistant Examiner*—U. K. Rajguru
*Attorney, Agent, or Firm*—Sherman and Shalloway

[57] ABSTRACT

The resin composition for forming plated layer disclosed herein comprises a polyamide composed of a dicarboxylic acid component recuring unit and a recurring unit derived from a diamine component unit having an alkylene group of 4 to 25 carbon atoms and at least one inorganic filler. There are also disclosed the resin molded article having plated layer formed thereon, the electromagnetic wave shielding material, the decorative resin molded article and the connecting material produced by forming plated layer on the surfaces of the resin molded articles formed from said resin composition. Further, there is disclosed the printed circuit board produced by forming selectively metallized layer in wiring circuit portion on the surface of the resin molded article formed from said resin composition and the method for plating to form these articles having the layer plated thereon.

18 Claims, No Drawings

RESIN COMPOSITION FOR FORMING PLATED LAYER AND USE THEREOF

This application is a continuation of application Ser. No. 07/928,085, filed Aug. 13, 1992 now abandoned; which is a division of application Ser. No. 07/549,067, filed Jul. 6, 1990 now abandoned.

FIELD OF THE INVENTION

This invention relates to resin compositions for forming plated layer, which are excellent in adhesion to plated layer, have excellent heat resistance and can be easily processed into molded articles. It also relates to use thereof.

BACKGROUND OF THE INVENTION

Resin molded articles having plated layer formed thereon, which have metallized layer on the surfaces thereof by plating methods, are widely used as decorative resin molded articles which are metal substitutes, or as circuit members which electrically connects circuits or apparatuses through a metallized layer formed on the surfaces thereof in addition to electromagnetic wave shielding members and printed circuit boards (hereinafter, these articles are sometimes generally called as resin molded articles having plated layer formed thereon).

Thermosetting resins such as phenolic resins and epoxy resins, polyimides or polyamides have been used as resins for forming said resin molded articles having plated layer formed thereon.

For example, resin molded articles having plated layer formed thereon by forming plated layer on resin molded articles composed of polyamides have been used as metal substitutes for electrical and electronic components or automotive parts, because polyamides are relatively excellent in mechanical characteristics and heat resistance.

Printed circuit boards produced by forming partially plated layer on the surfaces of molded articles of resins such as polysulfone, polyethersulfone and polyetherimide are known (see, Japanese Laid Open Patent Publication No. 239694/1986 and Japanese Patent Publication Nos. 36290/1979 and 31915/1981).

However, when thermosetting resins are used, it is necessary that uncured thermoplastic resins are processed into a desired shape and then cured to produce resin molded articles. Accordingly, there is a problem that the manufacturing process of the resin molded articles having plated layer formed thereon becomes complicated.

Further, the above-mentioned thermosetting resins and such a resin as polysulfone have such a problem that heat resistance is poor. Accordingly, when printed circuit boards are produced by using these resins, there is a problem that the heat resistance of the resins reaches its limit when soldering temperature is elevated to increase the mounting speed of electronic components on the printed circuit boards.

Polyamides have not always sufficiently high heat resistance, are highly water absorbing and have difficulty in forming plated layer having excellent adhesion. Hence, resin molded articles having plated layer formed thereon produced from polyamides have a problem in that they can not meet requirements for automotive decorative parts and parts for circuit-board such as a printed circuit board, which are used under particularly severe conditions.

Polyimides have a problem in that moldability is poor, though they have excellent heat resistance. Namely, when resin molded articles having metallized layer as described above are produced from polyimides, it is necessary that a polyimide precursor is dissolved in a specific solvent such as pyrrolidone, the resulting solution is cast and a curing reaction is carried out while removing the solvent. Hence, there is a problem that the production of resin molded articles having metallized layer is very complicated.

OBJECT OF THE INVENTION

The present invention is intended to solve such problems associated with the prior art as mentioned above and an object of the present invention is to provide resin compositions for forming plated layer thereon, which allow plated layer to be formed having excellent adhesion, have excellent heat resistance and can be easily molded.

Another object of the present invention relates to use thereof for providing resin molded articles having plated layer formed thereon, electromagnetic wave shielding materials, decorative resin molded articles, and circuit-boards such as printed circuit boards. Said articles or parts are obtained by forming plated layer on the molded articles of said resin compositions.

SUMMARY OF THE INVENTION

The resin compositions for forming plated layer according to the present invention are characterized by comprising a polyamide containing an aromatic dicarboxylic acid component unit and at least one inorganic filler.

The polyamide used in the present invention is preferably composed of:

[A] a dicarboxylic acid component recurring unit comprising 30 to 100 mol % of a terephthalic acid component unit and 0 to 40 mol % of an aromatic dicarboxylic acid component unit other than terephthalic acid and/or 0 to 70 mol % of an aliphatic dicarboxylic acid component unit having 4 to 20 carbon atoms, and

[B] a recurring unit comprising a diamine component unit having an alkyl group of 4 to 25 carbon atoms, said polyamide having a melting point of at least 280° C. and a glass transition temperature in amorphous portion of at least 70° C.

Since the resin compositions for forming plated layer contain the polyamide composed of the specific recurring units as mentioned above, the compositions have very excellent heat resistance. Further, since the polyamide contained in the resin compositions of the present invention is thermoplastic, resin molded articles can be produced therefrom by injection molding or extrusion molding.

Resin molded articles having plated layer formed thereon, electromagnetic wave shielding materials, decorative resin molded articles and circuit-boards such as printed circuit boards according to the present invention are produced by forming plated layer on the surfaces of molded articles produced from said resin compositions for forming plated layer.

The printed circuit boards of the present invention are produced by forming selectively metallized layers or wiring circuit portions of the surfaces of the molded articles formed from the above-mentioned resin compositions for forming plated layer.

The resin molded articles having plated layer formed thereon according to the present invention are excellent in heat resistance and can be easily produced, because the above-mentioned resin compositions are used.

The method for plating according to the present invention comprising a step of etching surface of a resin molded article formed from said resin composition by using acidic solution of chromic acid, a step of electroless plating the etched surface of the article and electrolytic plating the electroless plated surface of the article.

According to the method for plating of the invention, a plated layer having excellent adhesion properties to surface of the articles can be formed.

DETAILED DESCRIPTION OF THE INVENTION

The resin compositions for forming plated layer and the resin molded articles having plated layer formed thereon according to the present invention are illustrated in more detail below.

The resin composition for forming plated layer according to the present invention contains a polyamide composed of an aromatic dicarboxylic acid component recurring unit [A] and at least one inorganic filler.

The aromatic dicarboxylic acid component recurring unit [A] constituting the polyamide used in the present invention contains preferably a terephthalic acid component unit (a). The recurring unit containing such terephthalic acid component unit (a) may be represented by the following formula [II-a].

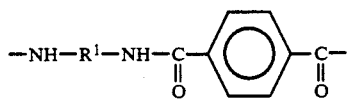

[II-a]

In the above formula [II-a], $R^1$ represents an alkylene group of 4 to 25 carbon atoms.

The aromatic dicarboxylic acid component unit constituting the polyamide used in the present invention may contain other dicarboxylic acid component units in addition to the above-mentioned terephthalic acid component unit (a).

Aromatic carboxylic acid component units (b) other than the terephthalic acid component unit (a) include component units derived from isophthalic acid, 2-methylterephthalic acid and naphthalenedicarboxylic acid. When the polyamide of the invention contains an aromatic dicarboxylic acid component unit other than terephthalic acid, an isophthalic acid component unit is particularly preferred.

The recurring unit having the isophthalic acid component unit, which is particularly preferred of the aromatic dicarboxylic acid component units other than terephthalic acid component unit may be represented by the following formula [II-b].

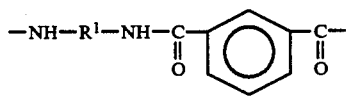

[II-b]

In the above formula [II-b], $R_1$ represents an alkylene group of 4 to 25 carbon atoms.

The polyamide used in the present invention may contain aliphatic dicarboxylic acid component unit (c) in addition to the aromatic dicarboxylic acid component unit (a).

The aliphatic dicarboxylic acid component unit constituting the polyamide is derived from an aliphatic dicarboxylic acid having an alkylene group of 4 to 20 carbon atoms, preferably of 6 to 12 carbon atoms. Examples of aliphatic dicarboxylic acid used for deriving the component unit (c) include succinic acid, adipic acid, azelaic acid and sebacic acid. When the polyamide of the invention contains such aliphatic dicarboxylic acid component unit, such component unit is preferably an adipic acid component unit in particular.

The recurring unit containing such aliphatic dicarboxylic acid component unit (c) may be represented by the following formula [III].

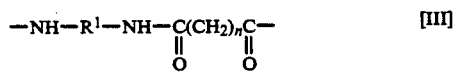

[III]

In the above formula [III], $R^1$ is as defined in the formula [II-a], and n represents an integer of 4 to 20, preferably 6 to 12.

The polyamide used in the present invention preferably contains said dicarboxylic acid component unit [A] and diamine component unit (d) containing alkylene groups of 4 to 20 carbon atoms, and/or cycloalkylenediamine component unit (e)[B].

Said diamine component unit (d) may be derived from aliphatic alkylenediamines of 6 to 18 carbon atoms.

Examples of alkylenediamines for use in deriving such aliphatic alkylenediamine component unit (d) include 1,4-diaminobutane, 1,6-diaminohexane, trimethyl-1,6-diaminohexane, 1,7-diaminoheptane, 1,8-diaminooctane, 1,9-diaminononane, 1,10-diaminodecane, 1,11-diaminoundecane and 1,12-diaminododecane.

Component units derived from straight-chain aliphatic alkylenediamines are particularly preferred as the diamine component unit (d) in the present invention. Preferred examples of such straight-chain aliphatic alkylenediamines include 1,4-diaminobutane, 1,6-diaminohexane, 1,8-diaminooctane, 1,10-diaminodecane, 1,12-diaminododecane and a mixture thereof. Of these diamines, 1,6-diaminohexane is particularly preferred.

Furthermore, the cycloalkylenediamine component unit (e) contained in the polyamide used in the invention is preferably derived from diamine of about 6 to 25 carbon atoms having at least one cyclic aliphaticalkylene.

The alkylene diamine component unit (e) includes component units derived from
1,3-diaminocyclohexane,
1,4-diaminocyclohexane,
1,3-bis(aminomethyl)cyclohexane,
1,4-bis(aminomethyl)cyclohexane,
isophoronediamine,
piperardine,
2,5-dimethylepiperadine,
bis(4-aminocyclohexyl)methane,
bis(4-aminocyclohexyl)propane,
4,4'-diamino-3,3'-dimethyldicyclohexylpropane,
4,4'-diamino-3,3'-dimethyldicyclohexylmethane,
4,4'-diamino-3,3'-dimethyl-5,5'-dimethyl-dicyclohexylmethane,
4,4'-diamino-3,3'-dimethyl-5,5'-dimethyl-dicyclohexylpropane, α-α'-bis(4-aminocyclohexyl)-p-diisopropylebenzene,
α-α'-bis(4-aminocyclohexyl)-m-diisopropylebenzene,
α-α'-bis(4-aminocyclohexyl)-1,4-cyclohexane,
α-α'-bis(4-aminocyclohexyl)-1,3-cyclohexane.

Of these cycloalkylenediamine component unit (e), bis (aminomethyl) cyclohexane, bis (4-aminocyclohexyl)methane, 4,4'-diamino-3,3'-dimethyldecyclohexylmethane are preferably used, and in particular, bis (4-aminocyclohexyl)methane, 1,3-bis(aminocyclohexyl)methane, 1,3-bis(aminomethyl)cyclohexane are preferred.

In the polyamide which is preferably used in the present invention, the dicarboxylic acid component recurring unit [A] is composed of 60 to 100 mol % of the terephthalic acid component unit (a), 0 to 40 mol % of the aromatic dicarboxylic acid component unit (b) other than terephthalic acid and 0 to 40 mol % of the aliphatic dicarboxylic acid component unit (c).

The polyamide used in the invention contains the terephthalic acid component unit (a) and the component unit (b) derived from dihydric aromatic carboxylic acids other than terephthalic acid which are represented by isophthalic acid as the aromatic dicarboxylic acid component units [A], and may contain the above-mentioned aliphatic acid component unit (c) and small amounts of a recurring unit component derived from polycarboxylic acids having at least three carboxyl groups such as trimellitic acid and pyromellitic acid in addition. The content in the polyamide used in the invention of the recurring unit containing the component unit derived from the above-mentioned polycarboxylic acid is usually from 0 to 5 mol %.

The above-mentioned polyamide has an intrinsic viscosity [η] as measured at 30° C. in conc. sulfuric acid of usually 0.5 to 3.0 dl/g, preferably 0.5 to 2.8 dl/g and more particularly 0.6 to 2.5 dl/g.

The polyamide used in the invention may be a polyamide mixture consisting of a polyamide having the recurring unit represented by the formula [II-a] as the principal recurring unit, a polyamide having the recurring unit represented by the formula [II-b] as the principal recurring unit and a polyamide having the recurring unit represented by the formula [III] as the principal recurring unit.

When the polyamide used in the present invention is a mixture, it is preferred that the mixture is a composition consisting of the polyamide having the principal recurring unit represented by the formula [II-a] and the polyamide having the principal recurring unit represented by the formula [II-b] and/or the polyamide having the principal recurring unit represented by the formula [III]. The content of the polyamide having the principal recurring unit represented by the formula [II-a] is usually at least 30%.

The mixing ratio of the polyamide having the principal recurring unit represented by the formula [II-a] and the mixture of the polyamide having the principal recurring unit represented by the formula [II-b] and the polyamide having the principal recurring unit represented by the formula [III] is usually 0:100 to 40:60, preferably 0:100 to 30:70 by weight.

The above-mentioned polyamide shows a melting point higher than that of conventionally used aliphatic polyamide. That is, the melting point of the polyamide preferably used in the invention is at least 280° C., preferably 290° to 340° C. Further, the above-mentioned polyamide has a glass transition temperature in its amorphous state of at least 70° C.

By using the polyamide having a melting point and a glass transition temperature in the amorphous portions falling within the above-mentioned ranges in the production of resin molded articles, no molten state of the resin used will be brought about even when the molded article is exposed to elevated temperatures. Further, the above-mentioned polyamide is excellent in moldability and hence resin molded articles of any desired shapes can readily be formed therefrom.

Further, the polyamide used in the invention has a glass transition temperature in the amorphous portion of at least 70° C. and hence cracks or the like defects scarcely occur even when exposed to elevated temperatures.

Furthermore, the polyamide used in the invention has a specific structure so that the polyamide has a high flexural modulus at high temperatures and also is low in water absorption properties in comparison with those so far in use, though conventional polyamide has a problem with regard to water absorption properties.

The resin compositions for forming plated layer according to the present invention contain usually at least 50% by weight, preferably 60 to 100% by weight of the polyamide. The polyamide may be used alone or in combination with other resins. Other resins which may be used in combination with the polyamide are preferably heat resistant thermoplastic resins.

Examples of such heat resistant thermoplastic resins include polyolefins, PPS (polyphenylene sulfide), PPE (polyphenyl ether), PES (polyether sulfone), PEI (polyether imide) and LCP (liquid crystal polymers). Of these resins, particularly preferred in the present invention is polyphenylene sulfide.

The content of such heat resistant thermoplastic resin in the polyamide is usually less than 50% by weight, preferably 0 to 40% by weight.

The polyamide (or polyamide composition) and the resins which may be used together with the polyamide can be produced by conventional methods.

The inorganic fillers used together with the above-mentioned polyamide in the present invention are fibrous, granular, needle-like, flake or plate fillers and includes alkaline earth metal carbonate, oxide and silicate, metallic fiber, asbestos, ceramic fiber, titanium dioxide, aluminium oxide, mica, talc, barium sulfate, plaster, zirconium oxide, antimony oxide, clay, silica, silica-alumina, alumina, sericite, kaolin, diatomite, magnesium carbonate, feldspar, silica stone, carbon brack, glass bead, Shirasu balloon, red oxide, zinc oxide and Syloid.

The alkaline earth metal carbonate includes magnesium carbonate, calcium carbonate and barium carbonate, the alkaline earth metal oxide includes magnesium oxide, calcium oxide and barium oxide, and the alkaline earth metal silicate includes calcium silicate and magnesium silicate.

Of these fillers include, talc and/or the alkaline earth metal oxide, carbonate and silicate are preferably used, and in particular carbonate of alkaline metal or oxide of alkaline earth metal such as calcium carbonate or magnesium oxide are preferred these inorganic filler may be used either alone or as a mixture of two or more of them.

When the fillers used in the present invention is granular, they have desirably an average particle diameter of usually 0.1 to 200 μm, preferably 1 to 100 μm. Such granular fillers are used in an amount, based on 100 parts by weight of the polyamide, of usually not more than 100 parts by weight, preferably not more than 50 parts by weight, more preferably 5 to 40 parts by weight. Molded articles formed from the aromatic polyamide containing such alkaline earth metal carbonates are found to have excellent adhesion between the resin and plated layer.

The preferred fibrous inorganic fillers used are glass fibers, potassium titanate fibers and boron fibers. Particularly preferred in the present invention is glass fiber. By using glass fibers, molded articles formed from the resin compositions are improved in mechanical characteristics such as tensile strength, bending strength, flexural modulus, etc. and in heat resistant characteristics such as heat distortion temperature.

The glass fibers as mentioned above have an average length of usually 0.1 to 20 mm, preferably 0.3 to 6 mm and an aspect ratio of usually 10 to 2000, preferably 30 to 600. By using the glass fibers having an average length and an aspect ratio falling within the above-mentioned ranges, the polyamide compositions are improved in moldability and molded articles having plated layer thereon formed from the polyamide compositions containing the glass fibers are improved in heat resistant characteristics such as heat distortion temperature and in mechanical characteristics such as tensile strength, flexural strength, etc.

The glass fibers are used in an amount, based on 100 parts by weight of the polyamide, of usually not more than 200 parts by weight, preferably 5 to 180 parts by weight, more preferably 5 to 150 parts by weight.

In the present invention, the resin compositions for forming plated layer may be incorporated, besides the above-mentioned granular inorganic fillers and fibrous inorganic fillers, with organic or other inorganic fillers, antioxidants, ultraviolet light absorbers, light stabilizer, heat-resisting stabilizers, phosphite stabilizers, peroxide decomposing agents, basic auxiliary agents, nucleating agents, plasticizers, lubricants, antistatic agents, flame retarders, dyes, etc. The fillers may be in the form of powder, granule, sheet, needle, cloth or mat. Examples of such fillers powdered, sheet-form, fibrous or cloth-form fabricated articles of wholly aromatic polyamides such as poly-p-phenylene terephthalamide, poly-m-phenylene terephthalamide, poly-p-phenylene isophthalamide, poly-m-phenylene isophthalamide and condensates of diaminodiphenyl ether with terephthalic acid (isophthalic acid) or p-(m-) aminobenzoic acid, wholly aromatic polyamide-imides such as condensates of diaminodiphenyl ether with trimellitic anhydride or pyromellitic anhydride, wholly aromatic polyesters, wholly aromatic polyimides, heterocyclic ring-containing compounds such as polybenzimidazole and polyimidazophenanthroline, polytetrafluoroethylene, etc.

These fillers may be used either alone or as a mixture of two or more of them. These fillers may be treated with silane coupling agents or titanium coupling agents.

The powdered fillers have an average particle diameter of usually 0.1 to 200 μm, preferably 1 to 100 μm.

The powdered fillers are used in an amount, based on 100 parts by weight of the polyamide, of usually not more than 200 parts by weight, preferably not more than 100 parts by weight, more preferably 0.5 to 50 parts by weight.

The above-mentioned polyamide (or polyamide composition) may contain electrically conductive materials to shield effectively electromagnetic wave.

Examples of such electrically conductive materials include metals such as iron, aluminum, copper and stainless steel and nickel-coated graphite. Such electrically conductive materials may be in the form of fiber, bundled fiber or powder to incorporate them into resins.

The above-mentioned inorganic filler optionally together with the organic filler can be blended with the polyamide by kneading the components constituting the polyamide composition with the fillers and optionally other resins while each of the components of the polyamide composition is kept in the molten state. Conventional kneading apparatuses such as extruders and kneaders can be used.

The thus-obtained composition may be molded into an article having a desired shape by such molding technique as compression molding, injection molding, extrusion molding or the like.

The resin molded articles having plated layer formed thereon, the electromagnetic wave shielding materials, the decorative resin molded articles and the circuit-boards such as the printed circuit boards according to the present invention have metallized layers (plated layers) formed on the surfaces of the resin molded articles, which are formed in the manner mentioned above by plating methods.

In the resin molded articles having plated layer formed thereon, electromagnetic wave shielding materials, decorative resin molded articles and circuit-boards such as printed circuit boards of the present invention, plated layers may be formed at any positions on the surfaces of the resin molded articles, but in the printed circuit boards, plated layers are selectively formed on wiring circuit portions.

These resin molded articles having plated layer formed thereon according to the present invention may be processed into any form such as film, sheet or box without particular limitation with regard to the shape of the resin molded articles.

Now, methods for forming metallized layers on the surfaces of the resin molded articles formed from the resin compositions of the present invention by plating methods will be illustrated below.

Plating of polyamide resins such as nylon 66 with metals are already known.

Namely, when the polyamide resins are plated, the polyamide resins are usually etched with an acid solution such as hydrochloric acid, sulfuric acid or nitric acid and then plated with metals.

For example, there is described in *Polyamide Resin Handbook* (p. 264, written Osamu Fukumoto, published by Nikkan Kogyo Shinbunsha) that basic process comprises a step for etching (toughening surface) the resins, a chemical plating step and an electroplating step when the resins are plated with metals.

A large difference between the plating of the resins with metals and the plating of metals is in that a step for etching resins prior to conducting plating is provided when the resins are plated. The adhesion of chemically plated film to the resin is affected by the step and hence a choice of etching solutions is a very important factor. Namely, the point of the etching step is that uniform recessed traces are formed on the surface of a substrate (providing projected complexing effect).

For example, when aliphatic nylon containing a dense mineral filler is immersed in a hydrochloric acid type etching solution in the etching of a substrate composed of aliphatic nylon conventionally used, an amorphous layer on the surface of the substrate is dissolved to thereby roughen the surface of the substrate and a part of the filler drops out, thus forming recessed traces on the surface thereof.

In addition to the above-mentioned hydrochloric acid type etching solution, hydrofluoric acid which erodes the filler is used as the etching solution for the aliphatic polyamide. However, there is described that hydrochloric acid is suitable from the viewpoints of cost and performance.

The plating performance of products obtained, for example, by carrying out chemical plating and electroplating after using the above-mentioned etching solution varies depending on the surface profile of the substrate. Hence, the control of molding conditions is important to obtain the substrate of constant quality. The relationship between mold temperature during the molding of nylon and plate adhesion strength is shown in Table 1.

TABLE 1

| Mold temp. | Adhesion strength (kg/cm) |
|---|---|
| 85° C. | 1.22~1.52 |
| 95° C. | 1.07~1.27 |

Note: Plate - grade aliphatic nylon (nylon 6) (a product of Toray Industries, Inc.) was used.

Further, examples of plate adhesion strength and thermal shock resistance of films on plate-grade nylon GF30 (a product of Toray Industries, Inc.) are shown in Table 2.

TABLE 2

| Plate adhesion strength | 1.25~1.45 kg/cm |
|---|---|
| Thermal shock resistance | Wheel cap test piece (120° C. × 1 hr/−30° C. 1 hr) 100 cycle Neither swelling nor peeling were observed. (n = 3) |

Glass fiber-reinforces aliphatic nylon is inferior in plated appearance, but gives plated article having high plate adhesion. Hence, the plated article obtained therefrom is suitable for use as parts for which a high strength is required. Further, there is described that electromagnetic wave shielding properties can be imparted to resin materials by plating them with metals in the manner described above.

Further, Japanese Laid Open Patent Publication No. 155682/1985 discloses a method wherein nylon is etched with a mixed solution of phosphoric acid and sulfuric acid and then plated.

As-described above, many methods for plating resins with metals have been conventionally proposed. Certain methods have already been put to practical use.

However, polyamides conventionally subjected to plating are aliphatic nylons such as nylon 66. The plating of aromatic polyamides concerned with the present invention has been scarcely studied so far.

The present inventors have made attempts to plate aromatic polyamides with metals according to conventional methods and found that in many cases there is a difficulty in forming plated layer having sufficient adhesion even when etching treatment with acidic solutions conventionally used is carried out.

Further, the present inventors have made studies to find out an etching solution for forming plated layer having sufficient adhesion on the aromatic polyamide used in the invention and found that acidic chromic acid solutions, more specifically a solution of chromic acid/sulfuric acid and a solution of chromic acid/nitric acid which have not been used as etching solutions for polyamide as yet are most suitable.

Accordingly, it is preferred that acidic chromic acid solutions are used as etching solutions when a metallic thin film is formed on the molded articles formed from the resin compositions of the invention by utilizing plating methods.

Etching treatment with such acidic chromic acid solutions may be carried out in a similar manner to conventional acid treatment. However, when the aromatic polyamide base material to be treated is immersed in an acidic solution (the temperature of the treating solution being 50° to 80° C.) containing chromic acid at a concentration of 20 to 50% in particular, the condition of the base material is made very good.

When the resin compositions for forming plated layer according to present invention contain the inorganic filler, the molded articles formed therefrom are immersed in an acidic solution which is a good solvent for the polyamide and the alkaline earth metal carbonates, etc. and the surfaces of the molded articles are then made hydrophilic and roughened by chemical means such as an etching treatment in an oxidizing solution to thereby enable plated layer to be mechanically, firmly bonded to the surfaces of the molded articles.

Suitable acidic solutions include sulfuric acid, nitric acid hydrochloric acid, phosphoric acid and cresol, sulfuric acid solutions and nitric acid solutions are particularly preferred. Examples of the oxidizing solution used in the etching treatment include solutions of ammonium fluoride/nitric acid and hydrogen fluoride/nitric acid in addition to the solutions of chromic acid/sulfuric acid and chromic acid/nitric acid. Particularly preferred are chromic acid/nitric acid solution.

The etching treatment for roughening the surfaces of the molded articles is not limited to the chemical means as mentioned above, but may be carried by mechanical means such as sandblasting or by the combination of chemical means with mechanical means.

As concrete usages of the molded articles having plated layer formed thereon according to the present invention, the molded articles having chemical plated layers are used for the electromagnetic wave shielding materials as it is or after coating with paint. The molded articles having chemical plated layers are used for the decorative resin molded articles after electro-plating thereon.

A concrete example of chrome plating comprises a step of chemical plating with nickel and copper, and a step of usual electroplating consisting of semigloss nickel plating and bright nickel plating or chrome plating carried out after the semigloss nickel plating. However, the printed circuit boards of the invention have selectively plated layers on wiring circuit portions of the surfaces of the resin molded articles.

The circuit-boards can be produced by the following methods.

(a) A method (two-shot method) wherein the molded article having circuit pattern is formed in two stages with two different molding resin compositions. The adhesion of molded portion formed from the first resin composition to plated layer can be enhanced by adhesion promotion stage, and the first resin composition contains a plating catalyst or catalytically functions in plating by an activation stage. The adhesion of molded portion formed from the second resin composition to plated layer can not be enhanced by adhesion promotion, and the second resin composition neither contain any plating catalyst, nor catalytically functions by activation stage. The plated layer as circuit pattern on the molded article is selectively formed only the surface of the molded portion formed from the first resin composition.

(b) A photosensitizing process (PSP) wherein the molded article is adhesion promoted and treated with a metal salt solution which catalytically functions in plating by chemical or radiation reduction. The metal salt is reduced in the presence of a photomask of the desired circuit pattern to form metallic sites only in the circuit portion, and only the circuit portion is selectively plated.

(c) A method (Additive method) wherein the molded article is adhesion promoted and immersed in an activator solution for electroless plating to deposit a seeder on the surface of the molded article. A plating resist is formed on the portion of the surface other than the desired circuit pattern, and only the circuit portion is selectively plated.

(d) A method wherein the molded article is adhesion promoted and a conductive paste is printed by screen printing on the surface of the molded article to form the circuit portion, and the molded article is immersed in a plating solution to form selectively the plated layer only in the circuit portion.

Of the above-mentioned methods, particularly preferred are the methods (a) or (b) in order to form a three dimensional circuit on the surface of the molded article.

In an embodiment of the plating method, the resin molded article treated as mentioned above is washed with water, and Pd is then deposited on the surface of the base material (catalysting). An aqueous solution of a metal complex salt such as a tin-palladium complex salt (e.g., $PdCl_2$: 0.1 to 0.4 g/l, $SnCl_2 \cdot 2H_2O$: 5 to 30 g/l, 36% HCl: 100 to 300 ml/l) is used for the catalysting. The catalysting using such an aqueous solution is usually carried out by setting the temperature to from 20° to 40° C. and the time to from 1 to 5 minutes. After the catalysting is carried out in the manner described above, acceleration is conducted by using an aqueous solution of acid such as hydrogen chloride and sulfuric acid, and chemical plating is then carried out by using an electroless plating solution to form a metal-plated layer such as a copper-plated layer, nickel-plated layer or a nickel/copper-plated layer on the base material. The electroless plating is usually carried out at a temperature of 20° to 40° C. over a period of 5 to 30 minutes.

Base materials having metallized layers formed thereon by chemical plating in the manner described above may be used as the molded articles having plated layer formed thereon in the present invention. Electrolytically plated layer can be formed on the electrolessly plated layer. The electrolytically plated layer can be formed by conventional methods.

The metal-plated layer, that is, conductive layer formed in the manner described above has a thickness of usually 0.1 to 2.0 μm, preferably 0.4 to 1.6 μm.

While the method for producing the molded articles having plated layer formed thereon by metal plating method has been illustrated in some detail as an example by the above-mentioned electroless plating method comprising the steps of etching, catalysting, accelerator, electroless plating and electrolytic plating, the molded articles having plated layer formed thereon according to the present invention are not limited to those produced by the above-mentioned method.

Further, in case of plating the resin composition according to the present invention, the moisture absorption of the articles formed from the resin composition must be considered as in the case where the conventional polyamide resin is coated, adhered or plated etc.

This fact is disclosed by Kimiaki Kanki that it must be so careful that the molded articles to be coated don't absorb water [(Toshiba), Sikizai 54(7), 451(1981), "problems of coating of plastic moldings"].

EFFECT OF THE INVENTION

The resin compositions for forming plated layer according to the present invention contain the polyamide comprising the specific recurring units as mentioned above so that the molded articles formed therefrom are low in water absorption properties, have a high adhesion strength to the plated layer and are very excellent in heat resistance. The polyamide contained in the resin compositions is thermoplastic and hence the resin compositions can be molded into various resin molded articles of any desired shapes by such molding technique as injection molding, extrusion molding or the like. The molded articles having plated layer formed thereon can be advantageously used for various purposes.

The resin molded articles having plated layer formed thereon, the electromagnetic wave shielding materials, the decorative resin molded articles and the circuit-boards such as the printed circuit boards according to the present invention have plated layers formed on the surfaces of the molded articles formed from the above-mentioned resin compositions and hence they are excellent in heat resistance, can easily be produced and have the following advantages according to their uses.

The electromagnetic wave shielding materials and connecting materials of the present invention are produced from the molded articles formed from the above-mentioned resin compositions containing the polyamide having excellent heat resistance so that they can sufficiently withstand heat when these materials are incorporated into devices or are used, and further they can withstand working heat as well as soldering heat. Soldering portions scarcely suffer solder cracks caused by linear expansion due to heating.

The decorative resin molded articles of the present invention have very good heat resistance. They have plated layers formed by plating method so that they have sheeny surface appearance. The adhesion of the molded articles to the plated layers is high so that they can be advantageously used as metal substitutes for automotive parts which are used under severe conditions.

The method for plating according to the present invention comprising a step of etching surface of a resin molded article formed from said resin composition by using acidic solution of chromic acid, a step of carrying out electroless plating the etched surface of the article and a step of carrying out electroplating the surface of the plated layer.

According to the method for plating of the invention, a plated layer having excellent adhesion properties to surface of the articles can be formed.

The present invention is further illustrated in more detail by the following examples. It should be appreciated that the invention is not restricted to the examples.

Example 1

Molding

Using an ordinary twin-screw vented pelletizer (PCM45 manufactured by Ikegai Iron Works Ltd.), pellets were prepared by pouring through a hopper 60 parts by weight of a polyamide resin having the composition mentioned herein below into the pelletizer and pouring further through a side feeder 40 parts by weight of glass fiber (chopped strand of 13 μm in diameter and 3 mm in length) and presetting the cylinder temperature at 340° C.

The polyamide used contained 50 mol % of the dicarboxylic acid component unit consisting of 35 mol % of terephthalic acid component unit and 15 mol % of isophthalic acid component unit (the aromatic dicarboxylic acid component unit other than terephthalic acid) and as the diamine component unit 50 mol % of hexamethylenediamine component unit. The polyamide had an intrinsic viscosity [η] (as measured at 30° C. in conc. sulfuric acid) of 1.1 dl/g and a glass transition temperature of 125° C.

Using an injection molding machine (IS 55 EPN manufactured by Toshiba Machine Co., Ltd.), the pellets obtained were injection molded at the cylinder temperature of 330° C. and the mold temperature of 120° C. to prepare a resin molded article of 2×120×130 mm.

Plating

The molded article obtained above was subjected to degreasing by wiping with a cloth immersed in isopropyl-alcohol and immersing for 3 minutes in a cleaning solution containing 50 g/l of OPC-250 Cleaner (trade name, manufactured by OKUNO SEIYAKU KK).

The molded article thus degreased was subjected to the surface treatment by immersing it for 10 minutes in an acidic aqueous solution of choromic acid at 70° C. containing 200 ml/l of conc. sulfuric acid, 400 g/l of chromic acid and 0.3 g/l of Top Shut (trade name, manufactured by OKUNO SEIYAKU KK).

The molded article thus treated was washed at room temperature with aqueous solution containing 5% by weight of 35% HCL, and then immersed for 5 minutes in an aqueous solution at 45° C. containing 200 ml/l of B-200 (trade name, manufactured by OKUNO SEIYAKU KK).

Then, the molded article thus treated was immersed for 4 minutes in an aqueous solution at 25° C. containing tinpalladium complex salt (trade name: A 30 Catalyst, manufactured by OKUNO SEIYAKU KK), hydrogen chloride and water at the volume ratio of 1:1:5.

And then, the molded article was subjected to acceleration by immersing it for 4 minutes in an aqueous solution of hydrochloric acid at 50° C. containing 10% by weight of 38% HCL.

The molded articles treated above, immersed for 10 minutes in an electroless plating solution at 40° C. containing TMP Chemical Nickel A solution, Nickel B solution (trade names, both are manufactured by Okuno Seiyaku Kogyo KK) and water at the volume ratio of 1:1:4 to form a nickel-plated layer of 1 μm. After the electroless plating, the molded article was subjected to electrolytic copper plating. The plated layer thus formed was evaluated by an exterior thereof and adhesion strength.

An adhesion strength of the plated layer of the thus obtained resin molded article is shown by the mean value calculated from the values obtaining by measuring the adhesion strength by Instron tester (10 mm of peeling width, 30 mm/minute of peeling rate and 90° of peeling angle). The results are shown in Table 4.

Between the above-mentioned treatment steps, there was properly included a water-washing step.

Examples 2 to 1

The procedure of Example 1 was repeated except that the inorganic filler indicated in Table 3 were used in place of glass fiber.

The exterior, the result of the peeling test and the adhesion strength of the plated layers of the resulting resin molded articles having plated layers formed thereon are shown in Table 4.

TABLE 3

|  | Filler |  | Polyamide Resin |
|---|---|---|---|
| Example 2 | Glass fiber*1 | 10 parts | 70 parts |
|  | talc*2 | 20 parts |  |
| Example 3 | Glass fiber | 10 parts | 70 parts |
|  | calcium silicate*3 | 20 parts |  |
| Example 4 | Glass fiber | 10 parts | 70 parts |
|  | magnesium oxide*4 | 20 parts |  |
| Example 5 | Glass fiber | 10 parts | 80 parts |
|  | calcium carbonate*5 | 10 parts |  |
| Example 6 | Glass fiber | 10 parts | 70 parts |
|  | calcium carbonate | 20 parts |  |
| Example 7 | Glass fiber | 10 parts | 60 parts |
|  | calcium carbonate | 30 parts |  |
| Example 8 | Glass fiber | 30 parts | 50 parts |
|  | calcium carbonate | 20 parts |  |
| Example 9 | Glass fiber | 20 parts | 60 parts |
|  | calcium carbonate | 20 parts |  |
| Example 10 | Glass fiber | 10 parts | 30 parts |
|  | calcium carbonate*6 | 20 parts |  |

*103MA 486A, a product of Asahi Fiber Glass KK
*2PP, a product of Matsumura Sangyo KK
*3NYAD 325, a product of NYCO
*4High-purity Magnesium Oxide B, a product of Kyowa Kagaku Kogyo KK
*5Super #1500, 1.5-2.3 μm of diameter, a product of Maruo Calcium KK
*6Specialaice S, 2.5-3.9 μm of diameter, a product of Maruo Calcium KK

Referential Example 1

The procedures of Example 1 was repeated except that a conc. hydrochloric acid solution was used in place of the acidic chromic acid solution to form a plated layer. The exterior and the adhesion strength of the plated layers and the result of peeling test are shown in Table 4.

Referential Example 2

The procedures of Example 1 was repeated except that the inorganic fillers were not used when a molded article was formed and then plating of the molded article was carried out in the same manner in Example 1.

The exterior and the adhesion strength of the plated layers and the result of peeling test are shown in Table 4.

TABLE 4

|  | Exterior | Tape peeling test | Peeling strength (Kg/cm) |
|---|---|---|---|
| Example 1 | o | X | 0.1 |
| Example 2 | o | X | 0.2 |
| Example 3 | o | o | 0.5 |
| Example 4 | o | o | 1.1 |
| Example 5 | o | o | 1.2 |
| Example 6 | o | o | 1.6 |
| Example 7 | o | o | 1.8 |
| Example 8 | o | o | 1.8 |
| Example 9 | o | o | 1.7 |

TABLE 4-continued

| | Exterior | Tape peeling test | Peeling strength (Kg/cm) |
|---|---|---|---|
| Example 10 | o | o | 1.4 |
| Comp. Ex. 1 | X | X | ~0 |
| Comp. Ex. 2 | o | X | ~0 |

Exterior
o: good
X: no good (The plated layer was uneven and a portion not plated was observed.
Tape peeling test
o: passed
X: rejected
wherein a tape (Trade name Nichiban 405) adhered on the plated layer is pulled at right angler to the layer,
A layer which plated metal adhering on the tape was not observed is indicated by 0.
A layer which plated metal adhering on the tape was observed is indicated by X.

Example 11

The procedure of Example 1 was repeated except that a polyamide used contained as an acid component unit 60 mol % of terephthalic acid component unit and 40 mol % of adipic acid component unit, and had an intrinsic viscosity [η] of 1.13 dl/g and a melting point of 326° C. (a glass transition temperature thereof was 84° C.) and then a molded article obtained therefrom was plated. As a result, the plated layer had a good exterior, passed a tape peeling test and peeling strength thereof was 1.7 Kg/cm.

Example 12

The procedure of Example 11 was repeated except that a polyamide used contained as an acid component unit 30 mol % of terephthalic acid and 70 mol % of adipic acid component unit, and had an intrinsic viscosity [η] of 1.13 dl/g and a melting point of 281° C. (a glass transition temperature thereof was 71° C.). As a result, the plated layer had a good exterior passed a tape peeling test and a peeling strength thereof was 1.6 Kg/cm.

Example 13

The molded article of the Example 6 was used and the procedure of Example 6 was repeated except that an electroless plating aqueous solution containing 10 vol % of Chemical Copper New #100A, 10 vol % of Chemical Copper New #100B and 2.5 vol % of Chemical Copper New #100C (trade names, manufactured by OKUNO SEIYAKU KK) was used to form a copper plated layer of 1 μm, and then, electrolytic copper plating of Example 6 was immediately carried out to form a plated layer of 35 μm. When the molded article having the copper plated layer was immersed for 10 minutes in a solder bath kept at 250° C., any changes in the exterior thereof were not observed.

Example 14

The electromagnetic wave shielding characteristics of the molded article having the plated copper layer thereon in Example 6 were examined. The performance thereof was evaluated by transmission line method wherein electromagnetic wave of a measuring frequency of 30, 100, 300 and 100 MHz was applied thereto. As a result, it was found that the attenuation of electromagnetic wave through the plated article had not less than 92 dB at any frequencies. Accordingly, the plated article was very excellent in electromagnetic wave shielding characteristics and in heat resistance.

What is claimed is:

1. A resin molded article for forming plated layer comprising a chromic acid surface etched resin molded article from a resin composition comprising (i) a polyamide comprising (a) a dicarboxylic acid component recurring unit comprising a dicarboxylic acid component unit consisting of 30 to 100 mole % of terephthalic acid component unit and 0 to 40 mole % of an aromatic dicarboxylic acid component unit other than terephthalic acid and/or 0 to 70 mole % of an aliphatic dicarboxylic acid component unit having an alkylene group of 4 to 20 carbon atoms and (b) a diamine component recurring unit comprising an alkylene diamine component unit having an alkylene group of 4 to 25 carbon atoms, said polyamide having a melting point of at least 280° C.; (ii) 5 to 100 parts by weight, per 100 parts by weight of said polyamide, of at least one material selected from the group consisting of alkaline earth metal carbonate and alkaline earth metal oxide; and (iii) 5 to 200 parts by weight, per 100 parts by weight of said polyamide, of glass fiber.

2. The resin molded article according to claim 1, wherein said polyamide has a glass transition temperature in the amorphous portion of at least 70° C.

3. The resin molded article according to claim 1, wherein said polyamide has an intrinsic viscosity, as measured in concentrated sulfuric acid, of 0.5 to 3.0 dl/g.

4. The resin molded article according to claim 1, wherein said alkylene group of said aliphatic dicarboxylic acid component has 6 to 12 carbon atoms.

5. The resin molded article according to claim 1, wherein said alkylene group of said alkylene diamine component has 6 to 18 carbon atoms.

6. The resin molded article according to claim 1, wherein said alkylene group of said alkylene diamine component is a straight-chain aliphatic group.

7. The resin molded article according to claim 1, wherein said alkylene group of said alkylene diamine component is a cyclic aliphatic group.

8. The resin molded article according to claim 1, wherein said polyamide has a melting point of 290° to 340° C.

9. The resin molded article according to claim 1, wherein said at least one material (ii) is granular with an average particle diameter of 0.1 to 200 μm.

10. The resin molded article according to claim 1, wherein said glass fiber has a length of 0.1 to 20 mm and an aspect ratio of 10 to 2,000.

11. The resin molded article according to 'claim 1, wherein said dicarboxylic acid component unit consists of 60 to 100 mole % of said terephthalic acid component unit, 0 to 40 mole % of said aromatic dicarboxylic acid component unit other than terephthalic acid and 0 to 40 mole % of said aliphatic dicarboxylic acid component unit.

12. The resin molded article according to claim 1, wherein said dicarboxylic acid component recurring unit further comprises 0 to 5 mole % of a polycarboxylic acid component unit consisting of polycarboxylic acids having at least three carboxyl groups.

13. The resin molded article according to claim 1, wherein said polyamide comprises at least 50% by weight of said resin composition.

14. The resin molded article according to claim 1, wherein said at least one material (ii) is present in an amount of 5 to 40 parts by weight, per 100 parts by weight of said polyamide.

15. The resin molded article according to claim 1, wherein said glass fibers (iii) are present in an amount of 5 to 150 parts by weight, per 100 parts by weight of said polyamide.

16. The resin molded article according to claim 1, wherein said at least one material (ii) is magnesium oxide.

17. The resin molded article according to claim 1, wherein said at least one material (ii) is calcium carbonate.

18. A resin molded article for forming plated layer produced by the process comprising:

providing a resin molded article from a resin composition comprising (i) a polyamide comprising (a) a dicarboxylic acid component recurring unit comprising a dicarboxylic acid component unit consisting of 30 to 100 mole % of terephthalic acid component unit and 0 to 40 mole % of an aromatic dicarboxylic acid component unit other than terephthalic acid and/or 0 to 70 mole % of an aliphatic dicarboxylic acid component unit having an alkylene group of 4 to 20 carbon atoms and (b) a diamine component recurring unit comprising an alkylene diamine component unit comprising an alkylene diamine component unit having an alkylene group of 4 to 25 carbon atoms, said polyamide having a melting point of at least 280° C., (ii) 5 to 100 parts by weight, per 100 parts by weight of said polyamide, of at least one material selected from the group consisting of alkaline earth metal carbonate and alkaline earth metal oxide and (iii) 5 to 200 parts by weight, per 100 parts by weight of said polyamide, of glass fiber; and etching a surface of said resin molded article with an acidic solution of chromic acid.

* * * * *